(12) United States Patent
Schmidt et al.

(10) Patent No.: US 7,868,427 B2
(45) Date of Patent: *Jan. 11, 2011

(54) STRUCTURE AND METHOD FOR PLACEMENT, SIZING AND SHAPING OF DUMMY STRUCTURES

(75) Inventors: Sebastian Schmidt, Dresden (DE); Hang-Yip Liu, Montrose, NY (US); Thomas Schafbauer, Ottobrunn (DE); Yayi Wei, Altamont, NY (US)

(73) Assignee: Infineon Technologies AG, Munich (DE)

( * ) Notice: Subject to any disclaimer, the term of this patent is extended or adjusted under 35 U.S.C. 154(b) by 25 days.

This patent is subject to a terminal disclaimer.

(21) Appl. No.: 12/353,193

(22) Filed: Jan. 13, 2009

(65) Prior Publication Data

US 2009/0124027 A1 May 14, 2009

Related U.S. Application Data

(60) Division of application No. 11/441,649, filed on May 26, 2006, now Pat. No. 7,494,930, which is a continuation of application No. 10/671,123, filed on Sep. 24, 2003, now Pat. No. 7,071,074.

(51) Int. Cl.
*H01L 21/76* (2006.01)
*H01L 21/4763* (2006.01)
*H01L 21/302* (2006.01)
*H01L 23/544* (2006.01)

(52) U.S. Cl. .................. 257/620; 438/427; 438/633; 438/692

(58) Field of Classification Search ................ 438/427, 438/633, 692; 257/620
See application file for complete search history.

(56) References Cited

U.S. PATENT DOCUMENTS

| 5,639,697 | A | 6/1997 | Weling et al. |
|---|---|---|---|
| 5,923,563 | A | 7/1999 | Lavin et al. |
| 6,253,362 | B1 | 6/2001 | Anand et al. |
| 6,486,066 | B2 | 11/2002 | Cleeves et al. |
| 6,567,964 | B2 | 5/2003 | Shin et al. |
| 6,611,045 | B2 | 8/2003 | Travis et al. |
| 6,683,382 | B2 | 1/2004 | Cwynar et al. |
| 6,961,915 | B2 | 11/2005 | Loh et al. |
| 7,071,074 | B2 | 7/2006 | Schmidt et al. |
| 7,124,386 | B2 | 10/2006 | Smith et al. |
| 2002/0061608 | A1 | 5/2002 | Kuroda et al. |
| 2003/0102562 | A1 | 6/2003 | Tomita |
| 2005/0132306 | A1 | 6/2005 | Smith et al. |

OTHER PUBLICATIONS

Lee, B., et al., "Using Smart Dummy Fill and Selective Reverse Etchback for Pattern Density Equalization," Proc. CMP-MIC, Mar. 2000, pp. 255-258, Santa Clara, CA.

*Primary Examiner*—William M. Brewster
(74) *Attorney, Agent, or Firm*—Slater & Matsil, L.L.P.

(57) ABSTRACT

A material layer on a substrate being processed, e.g. to form chips, includes one or more functional structures. In order to control pattern density during fabrication of the chip, dummy fill structures of different sizes and shapes are added to the chip at different distances from the functional structures of the material layer. In particular, the placement, size and shape of the dummy structures are determined as a function of a distance to, and density of, the functional structures of the material layer.

21 Claims, 2 Drawing Sheets

STRUCTURE AND METHOD FOR PLACEMENT, SIZING AND SHAPING OF DUMMY STRUCTURES

This application is a divisional of U.S. application Ser. No. 11/441,649, which was filed on May 26, 2006, and is now U.S. Pat. No. 7,494,930 issued Feb. 24, 2009, which, in turn, is a continuation of U.S. application Ser. No. 10/671,123, filed on Sep. 24, 2003 and is now U.S. Pat. No. 7,071,074, issued Jul. 4, 2006. Both applications are hereby incorporated herein by reference.

BACKGROUND

The present invention relates to microelectronic devices and micro-mechanical or micro-electromechanical devices (either type or both types hereinafter, "MEMs"), and more particularly, to a structure and method of providing dummy structures in a layer of material of a substrate during the fabrication of microelectronic devices and MEMs to achieve more uniform developer solution rates, etching rates, and rate at which the height of features of a layer are reduced during planarization processes such as chemical mechanical polishing (CMP).

In the fabrication of microelectronic devices of integrated circuits (ICs) and MEM dies (ICs and MEM dies also referred to herein as "chips"), it is important that certain processes be conducted at uniform rates across the surface of a substrate or wafer on which the chips are fabricated. This is needed despite the fact that the size of layout features and their density may vary from one point to another on the substrate. An example of such process is the development of an exposure pattern in a photoresist layer on a wafer. In such process, a photoresist (hereinafter "resist") layer is deposited onto a wafer and a photolithographic image is cast on the layer. Thereafter, a developer solution is applied to the resist layer, which chemically reacts with the exposed areas of the resist layer to remove such areas, leaving only the areas that are unexposed by the photolithographic image.

A problem occurs when a resist layer contains features of different densities and sizes. Under such circumstances, the concentration of reactants and reaction products varies from the densely patterned areas to the other areas. As a result, the developer solution used to etch away the exposed areas of the resist layer may etch the resist in the densely patterned areas at a slower rate than in the less densely patterned areas.

The etching of a material layer by a chemical etchant is another process that can vary in uniformity across a wafer depending upon the size and density of features. Again, variation in the size and density of features can cause the concentration of reactants and reaction products to vary, thus making the process nonuniform.

The polishing of material layers of a wafer is yet another process that can vary in uniformity across a wafer, depending upon the size and density of features. Polishing, especially chemical mechanical polishing (CMP) is often used in the fabrication of chips to reduce the topography of features in a material layer. Polishing may also be used to remove excess deposited material from above a patterned feature layer. For example, polishing is used to remove excess oxide after shallow trench isolations are filled and to remove excess metal after filling damascene metallization patterns. Polishing, especially CMP, is used to planarize a material layer.

A goal of such polishing processes is to smooth variations in the topography of features and, in some cases, to smooth a material layer to a uniformly planar surface. Failure to achieve such goals can hinder the function of features in a material layer and/or hinder subsequent processing in a manner that can cause device degradation and reduce yields.

It is known that the density of raised areas in a material layer directly affects the aforementioned rates. For example, it is known that the removal rate of material during polishing is inversely proportional to the surface area of the wafer in contact with the polisher. This surface area is also referred to herein as the "pattern density" which is directly proportional to the area of raised features on a wafer. Such raised features can be, for example, the result of material depositions to fill trenches and/or gaps within a dielectric material, a metal or semiconductor material.

Two chips having different layouts can have different pattern densities, and even one chip can have material layers which vary in pattern density across the chip. Wafers on which such chips are fabricated can themselves have areas near the edge that are smaller than the chip die size, and therefore not have any layout features in such areas. Consequently, CMP processing results in different removal rates in different areas of each such chip or wafer. If the same process is used to polish a corresponding layer of two wafers from which two different types of chips having different pattern densities are formed, results will vary for the two wafers. On the wafer having the greater pattern density, the height of features will be reduced to a lesser extent than the wafer having the lower pattern density.

A number of approaches have been developed in an effort to mitigate the effect of pattern density variations in wafer processing. U.S. Pat. No. 5,639,697 issued Jun. 17, 1997 to Weling et al. describes a method of using dummy structures in pattern layers of a wafer to provide more uniform pattern density across the wafer. The dummy structures serve to raise the pattern density in areas of the wafer. The dummy structures are not electrically active elements of the chip when fabrication is completed. As described in the above-mentioned patent, these dummy structures can be any shape and size and can be placed uniformly or non-uniformly in areas of the wafer. Thus, with the addition of dummy structures, areas of a wafer having different layouts can be made to approximate the same pattern density value to achieve, for example, improved planarization during CMP.

As an alternative, it is also known to use a method known as reverse etchback to reduce the pattern density in some fabrication processes. In this method, pattern density is controlled by removing material from a region of high material density by etching away portions of the raised areas, thus lowering the density (and, therefore, the surface area) of that region.

The article "Using Smart Dummy Fill and Selective Reverse Etchback for Pattern Density Equalization" by Lee et al., Proc. CMP-MIC, pp. 255-258, March 2000, describes another process for controlling pattern density of a layer during fabrication, for example, a shallow trench isolation (STI) fill layer. As described therein, variations in pattern density are reduced through a combination of reverse etchback and addition of dummy structures Unfortunately, the above techniques still have limitations with respect to improving the yield and reliability of chip fabrication.

SUMMARY OF THE INVENTION

Still, further improvements are desirable to control pattern density in processing material layers of a substrate. In particular, according to an aspect of the invention, the location, size, and/or shape of a dummy structure added to a material layer is selected on the basis of distance from neighboring functional features.

According to another aspect of the invention, the location, size, and/or shape of a dummy structure that are/is added to a material layer is selected on the basis of pattern density of neighboring functional features.

With the addition of dummy structures to the layout of a material layer of a substrate, it is possible to improve yield and reliability in the fabrication of chips. In an embodiment of the invention, a material layer of a substrate comprises a number of functional structures. In order to control pattern density during fabrication, dummy fill structures of different sizes are added to the material layer at different distances from the functional structures of the material layer. In particular, the placement and size and shape of the dummy structures are determined as a function of a distance to, and density of, the functional structure(s) in the material layer of the substrate.

In another embodiment of the invention, dummy structures are placed on a semiconductor device such that the dummy structures have different sizes and shapes. In particular, the different sizes and shapes of the dummy structures are selected as a function of the density and distance to the functional structures of the semiconductor device.

Another aspect of the invention relates to methods of fabricating a chip. First, the density ($\rho$), width (a) and location of functional structures of the chip are determined. Then, the shape, size and placement of a dummy structure is determined as a function of the density $\rho$ and the width a. In particular, the placement, $C_x$ of the dummy structure is a function of a and $\rho$; and the size of the dummy structure, $b_x$, is a function of the placement $C_x$. The shape of the dummy structure is preferably a function of the size $b_x$. The shape of the dummy structure is illustratively a regular polygon such that the enclosed area is illustratively maximized as a function of the size $b_x$.

DETAILED DESCRIPTION OF ILLUSTRATIVE EMBODIMENTS

Other than the inventive concept, the apparatus and methods for fabricating chips are well-known and are not described further herein. Also, like numbers on different figures represent similar elements.

Figure 1:
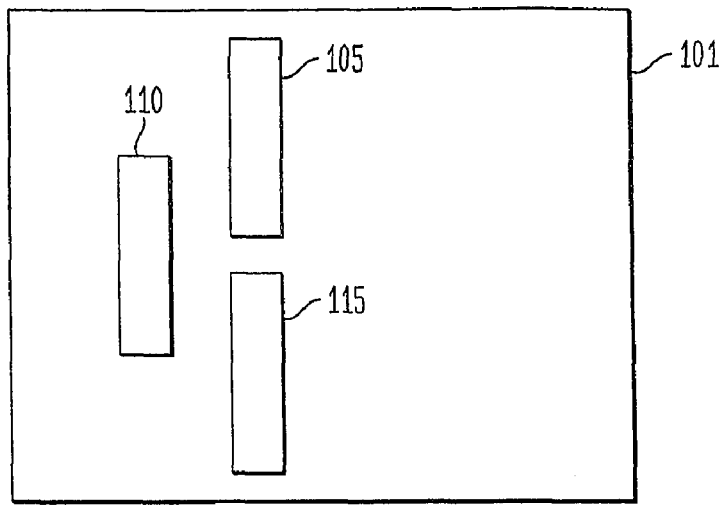
FIGS. 1 and 2 show diagrams of an illustrative semiconductor device in accordance with the principles of the invention.

A top view of a representative layer 101 of an illustrative substrate 100 or formed on such substrate 100 is shown in FIG. 1. Illustratively, substrate 100 can be a semiconductor wafer, or can be any one of many different types of substrates on which processing is performed to pattern one or more layers thereof or formed thereon in the fabrication of microelectronic devices, MEMs and associated packaging. As defined herein, "layer" can be a layer formed on a substrate and can be a portion or all of the substrate itself. Substrate 100 comprises three functional areas: 105, 110 and 115 arranged on a layer 101. These functional areas represent raised areas of a layer 101 and may include, but are not limited to, one or more of the following: active elements, passive elements, and conductive traces, for example.

For illustrative purposes only, only three functional areas are shown. A layer 101 may have more or less functional areas and a substrate may include one or more additional layers. In addition, the functional areas may include raised features that are disposed in more than one layer 101 of the substrate. As such, although the inventive concept is described in the context of layer 101, the inventive concept may also be applied to other layers. In addition, it should be noted that the inventive concept may also be applied to adding dummy structures to, e.g., an insulating oxide layer over a functional area such as a conductive trace. Further, the topography of substrate 100, i.e., the physical location of functional areas 105, 110 and 115 on layer 101 is merely illustrative.

In accordance with the inventive concept, in order to equilibrate developer solution rates and etching rates, and to maintain removal rate consistency during polishing (e.g., via use of CMP), dummy structures are added to a layer 101. Illustratively, dummy structures are added as a function of the distance to and density of the functional areas. Other than the inventive concept, methods for adding dummy structures to a layer are well known. In an example, dummy structures can be added to a layout of functional areas of a chip at the time of processing design data to create patterns of a photomask that include both functional areas and dummy structures. The photomask can then be used to produce corresponding structures on a layer 101. In another example, a layer 101 having raised features already formed on a substrate 100 can be altered with the addition of dummy structures to produce the desired pattern.

Figure 2:
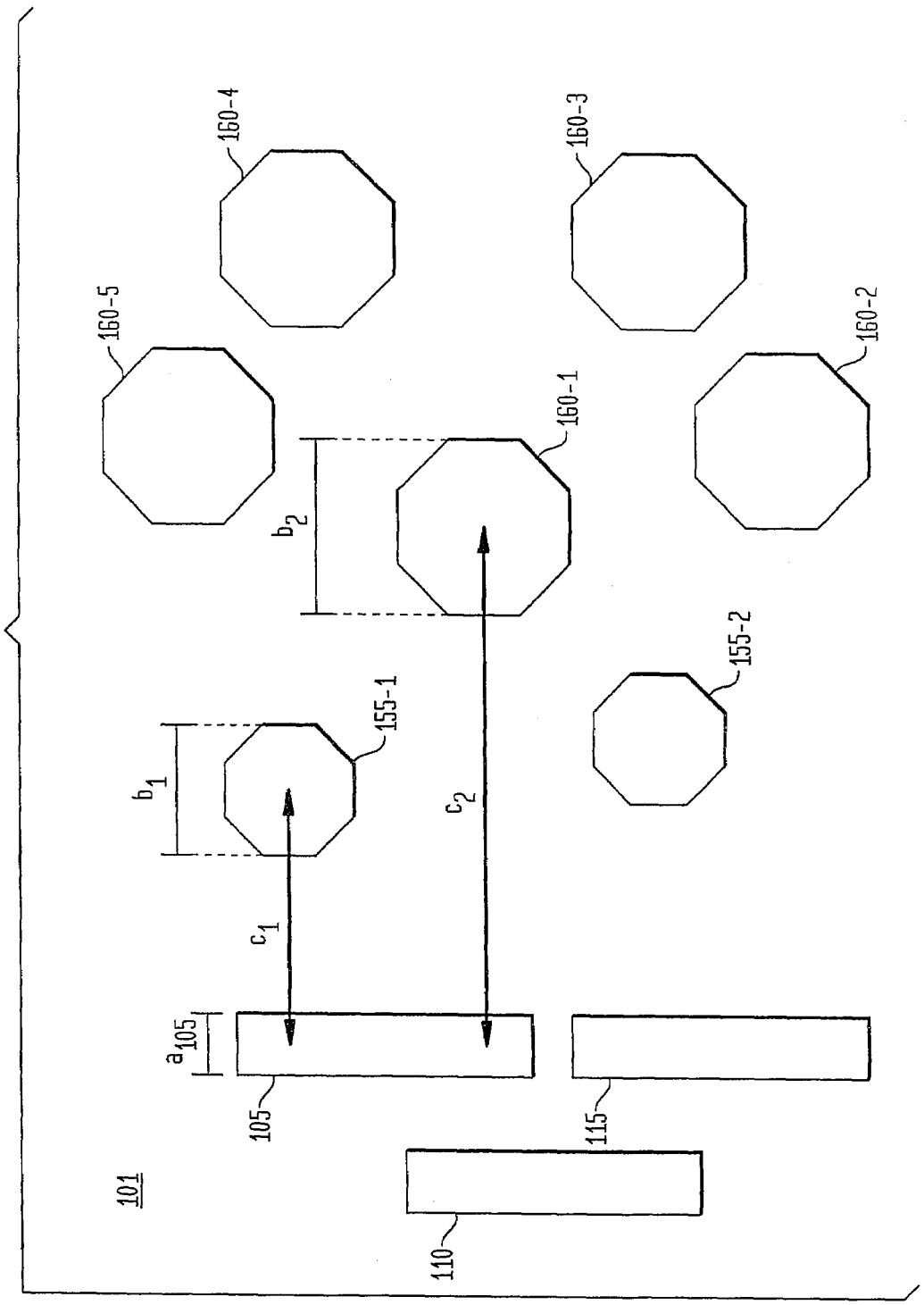

Turning now to FIG. 2, an illustrative arrangement of dummy structures on layer 101 of substrate 100 in accordance with the principles of the invention is shown. In particular a number of octagon shaped dummy structures have been added to layer 101. Illustratively, seven octagon shapes have been added. Shapes 155-1 and 155-2 represent two octagon shapes having the same dimensions, i.e., surface area. Similarly, shapes 160-1 to 160-5 represent five octagon shapes having the same dimensions, i.e., surface area. Illustratively, these octagonal shapes are regular polygons. However, the inventive concept is not so limited. As can be further observed from FIG. 2, functional areas 105, 110 and 115 have similar dimensions. Illustratively, functional area 105 has a width, $a_{105}$, and an associated density $\rho_{105}$.

In accordance with an aspect of the invention, the placement ($C_x$), size ($b_x$) and shape ($S_x$) of a dummy structure x to be added to a layer 101 is determined as a function of the width a and density $\rho(a)$ of one or more functional areas of the substrate.

Illustratively, the placement of a dummy structure, $C_x$, is determined by:

$$C_x = f(a, \rho(a)), \quad (1)$$

where, as noted above, a is the width of a functional area, while $\rho(a)$ represents the density of the functional area (where the density, $\rho$, is itself typically a function of the shape of the functional area).

The size of a dummy structure, $b_x$, is determined by:

$$b_x = f(C_x). \quad (2)$$

Finally, the shape of a dummy structure, $S_x$, is determined by:

$$S_x = f(b_x). \quad (3)$$

Assume that processing to add dummy structures to a material layer of a substrate is performed in a vertical direction relative to location and width of functional areas therein. With respect to equation (1), the function $f(a, \rho(a))$ selects the placement, size and shape of dummy structures to be added to a layer to the size of functional areas as represented by a and the density of the shapes ρ(a). An illustrative formula for this function is:

$$C_x = \alpha \sum_{i=1}^{i=n} \frac{1}{(a_i d_i)} + \beta \frac{n}{d_n} \quad (4)$$

where n is the number of nearest neighbor functional areas in the vertical direction to the location being processed, $d_n$ is the distance over which the n nearest neighbor functional areas are distributed, $a_i$ the size of each functional area in the vertical direction, and $d_i$ the distance between the ith functional area and the location being processed.

The distance $d_n$ is a parameter preferably selected by a computer or operator of a computer performing the processing such that it can be adjusted in accordance with the density of patterns on a particular material layer or a particular portion of a material layer. For example, when the distance between functional areas of a layer is large, the distance $d_n$ that is selected for processing should also be large. On the other hand, when the distance between functional areas of a layer is small, the distance $d_n$ can be correspondingly small in order for processing to be performed with the correct granularity.

The constants α and β are preferably selected based on experimental data. Preferably they are selected based on measurements of the width-control of the neighboring structures against different densities at which dummy structures are provided to fill a material layer.

The first term of equation (4) weights the vertical width $a_i$ of each neighbor functional area with the distance $d_i$ of each such functional area from the location being processed. The second term of equation (4) depends on the numerical density ($n/d_n$) of functional areas within the distance $d_n$ surrounding the location being processed. Accordingly, the placement $C_x$ of a dummy structure x, in units of distance from the nearest neighboring functional area, is determined based on a weighted sum of the pattern density within a space of distance $d_n$ surrounding the location, as well as the numerical density of the functional areas.

Thus, for example, when neighboring functional areas within distance $d_n$ surrounding the location being processed are disposed at relatively large distances $d_i$, the first term in equation (4) will be small. When there are relatively few such shapes over the distance $d_n$ selected for processing, the second term of equation (4) will be small. Accordingly, processing determines that the local pattern density and numerical density are low. The dummy structure is therefore placed at a distance $C_x$ which is close to the nearest functional area of the material layer.

Alternatively, when respective distances $d_i$ from the location being processed to neighboring functional areas is small, the first term of equation (4) becomes larger, such that the placement $C_x$ of a dummy structure is provided at a greater distance from the nearest functional area.

As can be observed from equation (2), the size of the dummy structure $b_x$ is a function of the placement $C_x$. The greater the distance $C_x$ at which a dummy structure is placed from a nearest neighbor functional area, the larger that the dummy structure is provided. In such manner, requirements for patterning dummy structures are relaxed in areas of low pattern density such as near edges of a chip and within areas of low circuit density. Moreover, the requirements for building and using critical dimensioned masks are relaxed because dummy structures having critical dimensions or near critical dimensions are not used except in such areas where they are specifically needed to match the numerical density of functional areas.

From equation (3), the shape of a dummy structure is a function of the size $b_x$. Illustratively, the shape of the dummy structure is a regular polygon such that the enclosed area is illustratively maximized as a function of the size $b_x$. In an embodiment, the shape of a dummy structure is selected based on the size $b_x$ of the dummy structure, such that larger dummy structures are patterned having a larger number of sides than smaller dummy structures. For example, a small dummy structure x can be a regular polygon having few sides due to photolithographic process constraints, for example, in patterning small features in the material layer. On the other hand, when the size of the dummy structure is large and such constraints are not as imposing, the dummy structure can be a regular polygon having a greater number of sides such that its shape more nearly approximates that of a circular disk.

As illustrated in FIG. 2, dummy structures are provided as having octagonal shapes as an example of a regular polygon. Other types of shapes may be used and different shapes may be arranged on the same layer.

Figure 3:
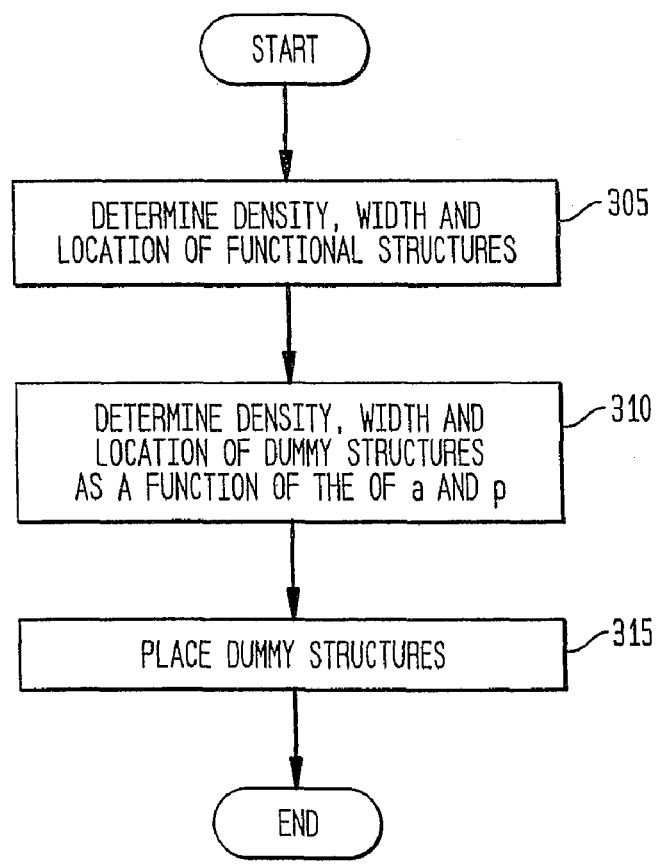
FIG. 3 shows an illustrative flow chart embodying the principles of the invention.

An illustrative flow chart of a method in accordance with the principles of the invention is shown in FIG. 3. First, the density (ρ), width (a) and location of n functional areas of a layer within a distance $d_n$ surrounding a location being processed are determined in step 305. Then, the placement, size and shape of a dummy structure are determined as a function of ρ and a in step 310. In particular, the placement, $C_x$, of the dummy structure is a function of a and ρ. The size of the dummy structure $b_x$ is a function of the placement $C_x$. The shape of the dummy structure is a function of the size $b_x$. The shape is illustratively a regular polygon such that the enclosed area is maximized. Finally, the dummy structures are placed in step 315.

As a result of the above, it is possible to further improve yield and reliability in semiconductor manufacturing processes. For example, in an example, dummy structures are added to a photoresist layer on a substrate to aid in equilibrating developer solution rates. In another example, dummy structures are added to a pattern of a layer to aid in making rates of etching material from that layer more uniform. In yet another example, dummy structures are added to a material layer to help achieve better planarization through a process such as CMP.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims. For example, although the inventive concept is illustrated in the context of an octagon shape, the inventive concept is not so limited. Also, the inventive concept is valid for application to any kind of material layer including the manufacture of compact discs, and flat panel displays.

What is claimed is:

1. A method for use in fabricating a chip comprising:
   providing at least two functional areas of a layer; and
   adding at least one dummy structure,
   wherein the adding comprises:
      determining placement of said at least one dummy structure as a function of a width of at least one of said at least two functional areas and a distance between said at least two functional areas; and determining a size of said at least one dummy structure as a function of the determined placement.

2. The method according to claim 1, wherein said at least two functional areas form active elements of said layer.

3. The method according to claim 1, further comprising determining a shape of said at least one dummy structure as a function of the determined size.

4. The method according to claim 1, wherein determining the size of said at least one dummy structure further comprises determining the size as a function of a functionality of said at least two functional areas.

5. The method according to claim 1, wherein determining the size and placement of said at least one dummy structure further comprises determining the size as a function of a functionality of said at least two functional areas.

6. The method according to claim 1, wherein determining the size and placement of said at least one dummy structure further comprises determining the size as a function of a local property of said at least two functional areas.

7. The method according to claim 1, wherein determining placement of said at least one dummy structure further comprises placement of said at least one dummy structure as a function of a width of a closer one of said at least two functional areas.

8. The method according to claim 1, wherein determining placement of said at least one dummy structure further comprises placement of said at least one dummy structure as a function of a width of a smaller one of said at least two functional areas.

9. The method according to claim 1, wherein determining the size of said at least one dummy structure further comprises determining the size as a function of a shape of one of said at least two functional areas.

10. The method according to claim 1, wherein determining the size of said at least one dummy structure further comprises determining the size as a function of functionality of said at least two functional areas and size of said at least two functional areas.

11. The method according to claim 1, wherein providing the at least two functional areas of the layer and adding the at least one dummy structure comprises fabricating a chip that includes the at least two functional areas and the at least one dummy structure.

12. A chip comprising:

at least two functional areas of a layer; and at least one dummy structure, each dummy structure being disposed at a location that is a function of a width of at least one of said at least two functional areas and a distance between said at least two functional areas and wherein each dummy structure has a size that is a function of the location.

13. The chip according to claim 12, wherein said at least two functional areas comprise active elements of said layer.

14. The chip according to claim 12, wherein each dummy structure has a shape that is a function of the size.

15. The chip according to claim 12, wherein the size of said at least one dummy structure is also a function of a functionality of said at least two functional areas.

16. The chip according to claim 12, wherein the size and location of said at least one dummy structure is a function of a functionality of said at least two functional areas.

17. The chip according to claim 12, wherein the size and location of said at least one dummy structure is a function of local properties of said at least two functional areas.

18. The chip according to claim 12, wherein the location of said at least one dummy structure is a function of a width of a closer one of said at least two functional areas.

19. The chip according to claim 12, wherein the location of said at least one dummy structure is also a function of a width of a smaller one of said at least two functional areas.

20. The chip according to claim 12, wherein the size of said at least one dummy structure is also a function of a shape of one of said at least two functional areas.

21. The chip according to claim 12, wherein the size of said at least one dummy structure is a function of functionality of said at least two functional areas and size of said at least two functional areas.

* * * * *